United States Patent
Siriani et al.

(10) Patent No.: US 11,018,473 B1
(45) Date of Patent: May 25, 2021

(54) SELECTIVE-AREA GROWTH OF III-V MATERIALS FOR INTEGRATION WITH SILICON PHOTONICS

(71) Applicant: Cisco Technology, Inc., San Jose, CA (US)

(72) Inventors: Dominic F. Siriani, Allentown, PA (US); Jock T. Bovington, La Mesa, CA (US); Vipulkumar K. Patel, Breinigsville, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/203,463

(22) Filed: Nov. 28, 2018

(51) Int. Cl.
*H01S 5/026* (2006.01)
*H01S 5/343* (2006.01)
(Continued)

(52) U.S. Cl.
CPC .............. *H01S 5/026* (2013.01); *G02B 6/122* (2013.01); *G02B 6/131* (2013.01); *G02B 6/136* (2013.01); *H01S 5/021* (2013.01); *H01S 5/028* (2013.01); *H01S 5/1014* (2013.01); *H01S 5/1028* (2013.01); *H01S 5/343* (2013.01); *G02B 2006/12061* (2013.01); *G02B 2006/12121* (2013.01)

(58) Field of Classification Search
CPC ...... G02B 6/136; G02B 6/12; G02B 6/12004; G02B 6/122–1228; G02B 6/13–132; H01S 5/0267; H01S 5/028; H01S 5/0287; H01S 5/021; H01S 5/005–0092; H01S 5/026–5/0268; H01S 5/0265–0268
See application file for complete search history.

(56) References Cited

U.S. PATENT DOCUMENTS 3,948,583 A * 4/1976 Tien .................... G02B 6/12004
  385/14
4,794,608 A * 12/1988 Fujita .................... H01S 5/0014
  372/45.01
(Continued)

OTHER PUBLICATIONS

Liu et al., "Electrically Pumped Continuous-wave 1.3 quantum-dot lasers epitaxially grown on on-axis (001) GaP/Si," Dec. 12, 2016, Optics Letters, 6 pages.
(Continued)

*Primary Examiner* — Tod T Van Roy
*Assistant Examiner* — Sean P Hagan
(74) *Attorney, Agent, or Firm* — Patterson + Sheridan, LLP

(57) ABSTRACT

Embodiments provide for selective-area growth of III-V materials for integration with silicon photonics. The resulting platform includes a substrate; an insulator, extending a first distance from the substrate, including a passive optical component at a second distance from the substrate less than the first distance, and defining a pit extending to the substrate; and a III-V component, extending from the substrate within in the pit defined in the insulator, the III-V component including a gain medium included at the second distance from the substrate and optically coupled with the passive optical component. The pit may define an Optical Coupling Interface between the III-V component and the passive optical component, or a slit defined between the III-V component and the passive optical component may define the Optical Coupling Interface.

20 Claims, 7 Drawing Sheets

(51) Int. Cl.
*H01S 5/02* (2006.01)
*G02B 6/136* (2006.01)
*G02B 6/122* (2006.01)
*H01S 5/028* (2006.01)
*H01S 5/10* (2021.01)
*G02B 6/13* (2006.01)
*G02B 6/12* (2006.01)

(56) References Cited

U.S. PATENT DOCUMENTS

| | | | | |
|---|---|---|---|---|
| 6,040,246 | A * | 3/2000 | Goldstein | G02B 6/12004 |
| | | | | 385/129 |
| 6,985,646 | B2 * | 1/2006 | Blauvelt | G02B 6/132 |
| | | | | 385/129 |
| 2007/0147762 | A1 * | 6/2007 | Kwakernaak | G02B 6/136 |
| | | | | 385/131 |
| 2008/0242062 | A1 * | 10/2008 | Bernasconi | C30B 25/04 |
| | | | | 438/494 |
| 2015/0372453 | A1 * | 12/2015 | Yamazaki | H01S 5/02252 |
| | | | | 359/344 |
| 2016/0087153 | A1 * | 3/2016 | Terashima | H01S 5/3412 |
| | | | | 372/49.01 |
| 2017/0040775 | A1 * | 2/2017 | Takabayashi | H01S 5/02248 |
| 2019/0273364 | A1 * | 9/2019 | Siriani | H01S 5/0203 |

OTHER PUBLICATIONS

Norman et al, "Electrically pumped continuous wave quantum dot lasers epitaxially grown on patterned, on-axis (001) Si," Optics Express, vol. 25, No. 4, Feb. 20, 2017, 8 pages.
Chen et al., "Electrically pumped continuous-wave 1.3 ?m InAs/GaAs quantum dot lasers monolithically grown on on-axis Si (001) substrates," Optics Express, vol. 25, No. 5, Mar. 6, 2017, 8 pages.
Wang et al., "1.3-?m InAs/GaAs quantum-dot lasers monolithically grown on Si substrates," 2011 Optical Society of America, 6 pages.

* cited by examiner

SELECTIVE-AREA GROWTH OF III-V MATERIALS FOR INTEGRATION WITH SILICON PHOTONICS

TECHNICAL FIELD

Embodiments presented in this disclosure generally relate to photonic integrated circuits. More specifically, embodiments disclosed herein relate to the fabrication of active gain materials for use with a silicon photonics platform.

BACKGROUND

Photonic Integrated Circuits (PICs) may include both active (i.e., powered) components, such as laser emitters, laser receivers, etc., and passive (i.e., not powered) components, such as waveguides, optical couplers, etc., which may be used as lasers, amplifiers, or the like. Many active components are made from III-V materials (i.e., compounds that include at least one Group III element (such as Boron, Aluminum, Gallium, Indium, or Thallium) and at least one Group V element (such as Nitrogen, Phosphorus, Arsenic, Antimony, or Bismuth)), and are mated to passive components that include Silicon (such as a Silicon substrate or a $SiO_2$ Interlayer Dielectric). Heterogeneous processes may include a coupon attachment of a III-V material to a Silicon material or an epitaxy deposition of a III-V material to a Silicon material.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure provides a method for selective-area growth of III-V materials for integration with silicon photonics, the method comprising: fabricating a photonic element on a substrate; forming an insulator on the photonic element; etching a pit through the insulator to the substrate, the pit defining an optical coupling interface (OCI) for the photonic element; forming an optical coating on the OCI affecting a reflectivity of the OCI; and forming a III-V component in the pit, the III-V component butt coupling with the photonic element via the OCI.

One embodiment presented in this disclosure provides a method for selective-area growth of III-V materials for integration with silicon photonics, the method comprising: fabricating a photonic element, including a substrate; forming an insulator on the photonic element; etching a pit through the insulator to the substrate; forming a III-V component in the pit, the III-V component butt coupling with the photonic element; and etching a slot between the III-V component and the insulator, the slot defining an optical coupling interface (OCI) between the photonic element and the III-V component.

One embodiment presented in this disclosure provides a Silicon Photonic Platform produced, including: a silicon substrate; an insulator, extending a first distance from the substrate, including a passive optical component at a second distance from the substrate less than the first distance, and defining a pit extending to the substrate; and a III-V component, extending from the substrate within in the pit defined in the insulator, the III-V component including a gain medium included at the second distance from the substrate and optically coupled with the passive optical component.

EXAMPLE EMBODIMENTS

A Selective-Area Growth (SAG) of III-V materials for integration with Silicon Photonics (SiPh) is provided herein to produce Photonic Integrated Circuits (PICs) with active and passive components using both III-V and Silicon materials that are integrated with one another. The III-V material used for active components is selectively formed in regions of a SiPh platform (e.g., Silicon On Insulator (SOI) wafers or Silicon Nitride (SiN) waveguides) and butt couples with the SiPh waveguides. Various Optical Coupling Interfaces (OCI) such as air voids or optical coatings may be used in various embodiments between the active and passive components of the PIC. The III-V material is selectively formed (e.g., grown, bonded) in a cavity defined in the Si material in contact with the substrate, which allows superior thermal performance and a more efficient fabrication (avoiding material waste and coupon bonding processes) over other heterogeneous PIC fabrication processes, which can result in poor thermal performance and material waste in creating the PIC compared to the processes described herein.

Figure 1A:
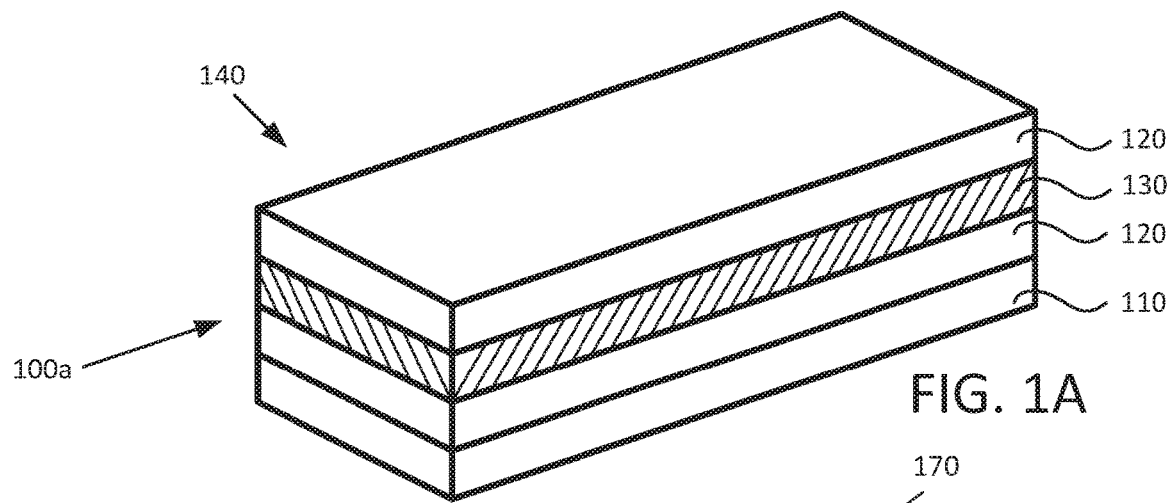
FIGS. 1A-1C illustrate isometric cutaway views of integrating a III-V component with a Silicon Photonic platform in various stages of fabrication via selective area growth, according to embodiments of the present disclosure.
Figure 1B:
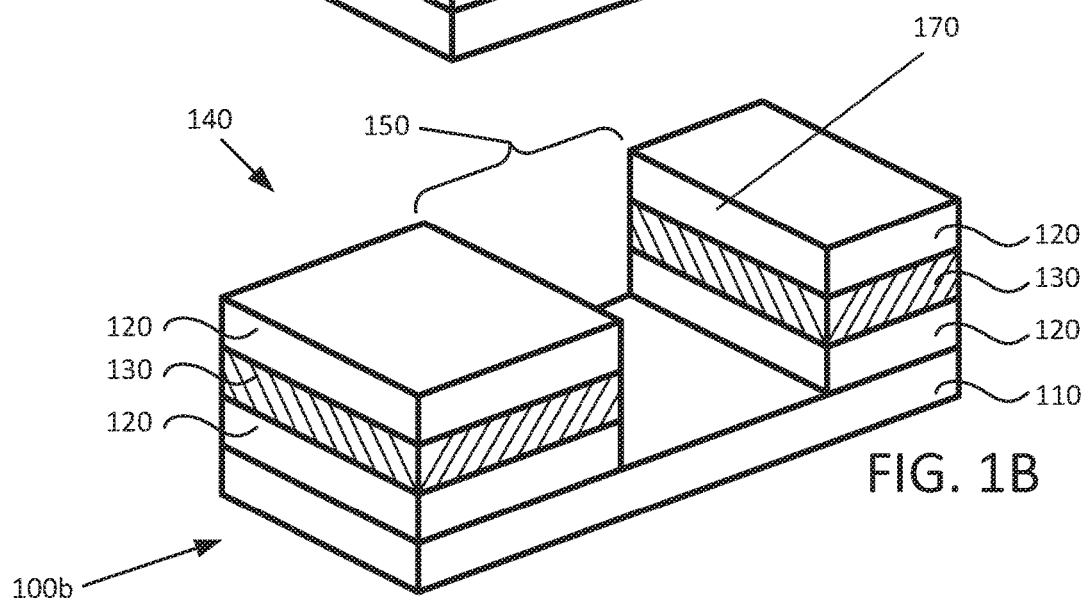
Figure 1C:
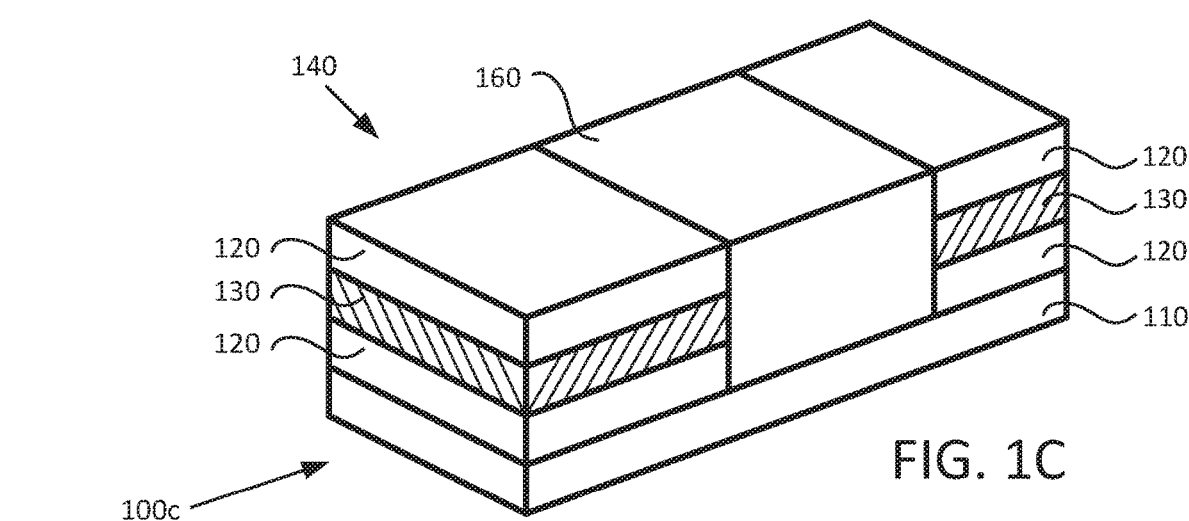
Figure 2A:
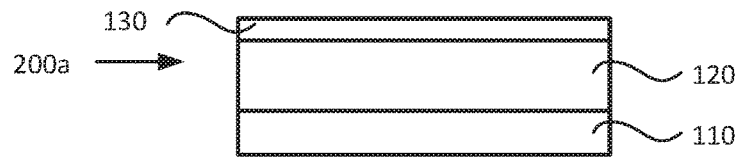
FIGS. 2A-2F illustrate cutaway views of integrating a III-V component with a Silicon Photonic platform in various stages of fabrication via selective area growth, according to embodiments of the present disclosure.
Figure 2B:
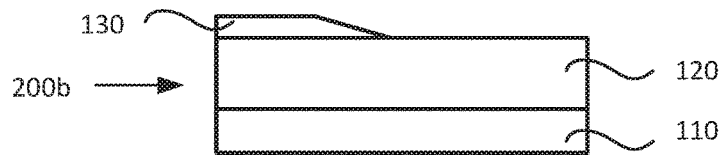
Figure 2C:
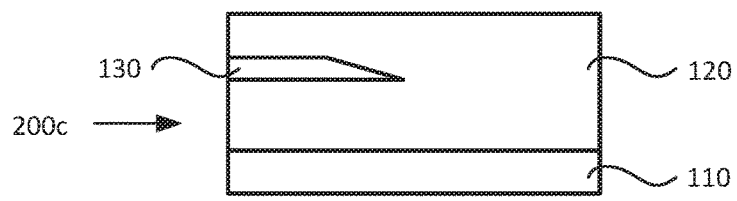
Figure 2D:
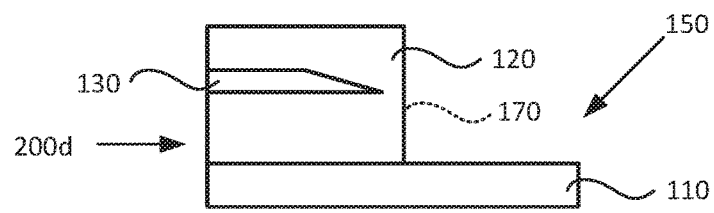
Figure 2E:
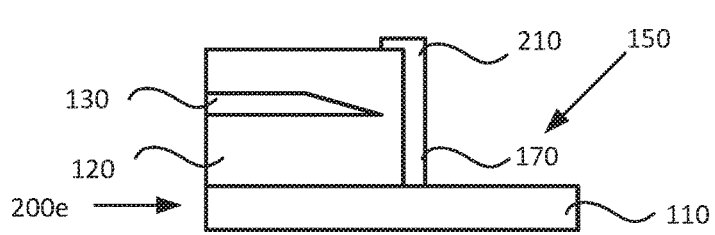
Figure 2F:
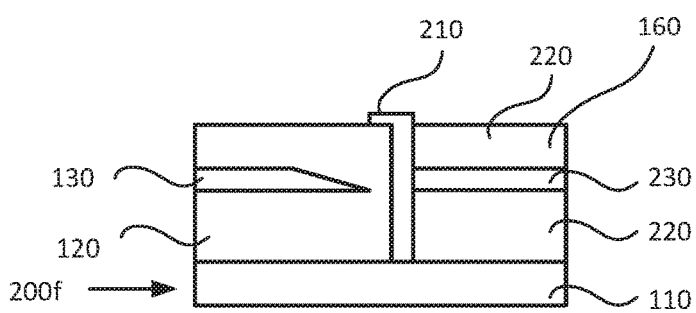

FIGS. 1A-1C illustrate isometric cutaway views 100a-c (generally, view 100) of integrating a III-V component 160 with a SiPh platform 140 in various stages of fabrication via selective area growth. The SiPh platform 140 includes a substrate 110, one or more layers of an insulator 120, and a passive optical layer 130.

The substrate 110 provides a base from which the other layers and components of the SiPh platform 140 are fabricated (e.g., via epitaxial growth, vapor deposition, eutectic bonding, etc.). In various embodiments, the substrate 110 is a Si wafer (including Silicon Nitride (SiN) or Silicon Dioxide ($SiO_2$) matrices) or a wafer made from a III-V material, such as, for example, Boron-Nitride (BN), Gallium-Nitride (GaN), GaAs (Gallium Arsenide), or InP (Indium Phosphide) that are cut on-axis for the material matrix thereof (i.e., using an on-cut III-V substrate material). In embodiments using a Si wafer, the wafer may be an on-axis or an off-axis cut for the crystalline structure of the Si material, which varies the material lattice of the face of the substrate 110 available for growth of additional layers of Si or III-V materials. For example, an off-axis Si wafer (i.e., a substrate 110 using an off-cut Si material may provide a lower number defects when forming a III-V material thereon than an on-axis Si wafer (i.e., a substrate 110 using an on-cut Si material), but may require different processing techniques than providing an on-axis Si wafer. In various embodiments using an off-axis Si material, the off-cut is between 1 degree and 10 degrees from the material matrix axis, for example, an off-cut from the material matrix axis of the substrate of 6 degrees.

The insulator 120 includes $SiO_2$ or SiN materials, which may be doped or processed to include various optical elements (such as the passive optical layer 130) and physical elements, such as, for example, alignment features, mating faces, and Through-Silicon-Vias (TSV).

The passive optical layer 130 includes one or more photonic elements secured in the insulator 120. A silicon waveguide (with various splitters, modulators, routing, etc.) is one example of a photonic element. Other examples of photonic elements include butt-coupling structures, such as, a nitride prong coupler or a silicon nano-taper (of the waveguide), evanescent coupling structures, such as, adiabatic or directional couplers, and passive alignment features.

View 100*b* shows a pit 150 defined in the SiPh platform 140 shown in view 100*a* that extends to the substrate 110. Although illustrated as defining an area of a rectangular prism, the pit 150 may be defined in areas having different shapes in other embodiments, such as, for example, a cylindrical area, a pyramidal area, a trapezoidal area, etc. The area defining the pit 150 provides space for a III-V component 160 to be formed from the substrate 110 to butt-couple with the other layers of the SiPh platform 140. In various embodiments, the III-V component 160 includes an optical gain medium that is aligned with the coupling features defined in the passive optical layer 130 at a first height relative to the substrate 110. View 100*c* shows that the III-V component 160 may form to a second height relative to the substrate 110 that the insulator 120 is also formed to, but in other embodiments the III-V component 160 may be formed to a different height than the insulator 120 relative to the substrate 110.

The pit 150 also defines an Optical Coupling Interface (OCI) 170 between the III-V component 160 and passive optical layer 130. In various embodiments, the OCI 170 may include an optical layer (e.g., 210 or 410) that is deposited or patterned either before or after the III-V component 160 is selectively formed in the pit 150. The optical layer may be a low-reflection or anti-reflection coating, a highly-reflective coating, an airgap, or a coating to impart a particular refractive index. Examples of OCI coatings include, but are not limited to: SiN (Silicon Nitride), $Ta_2O_5$ (Tantalum Pentoxide), $TiO_2$ (Titanium Dioxide), etc.

Figure 3:
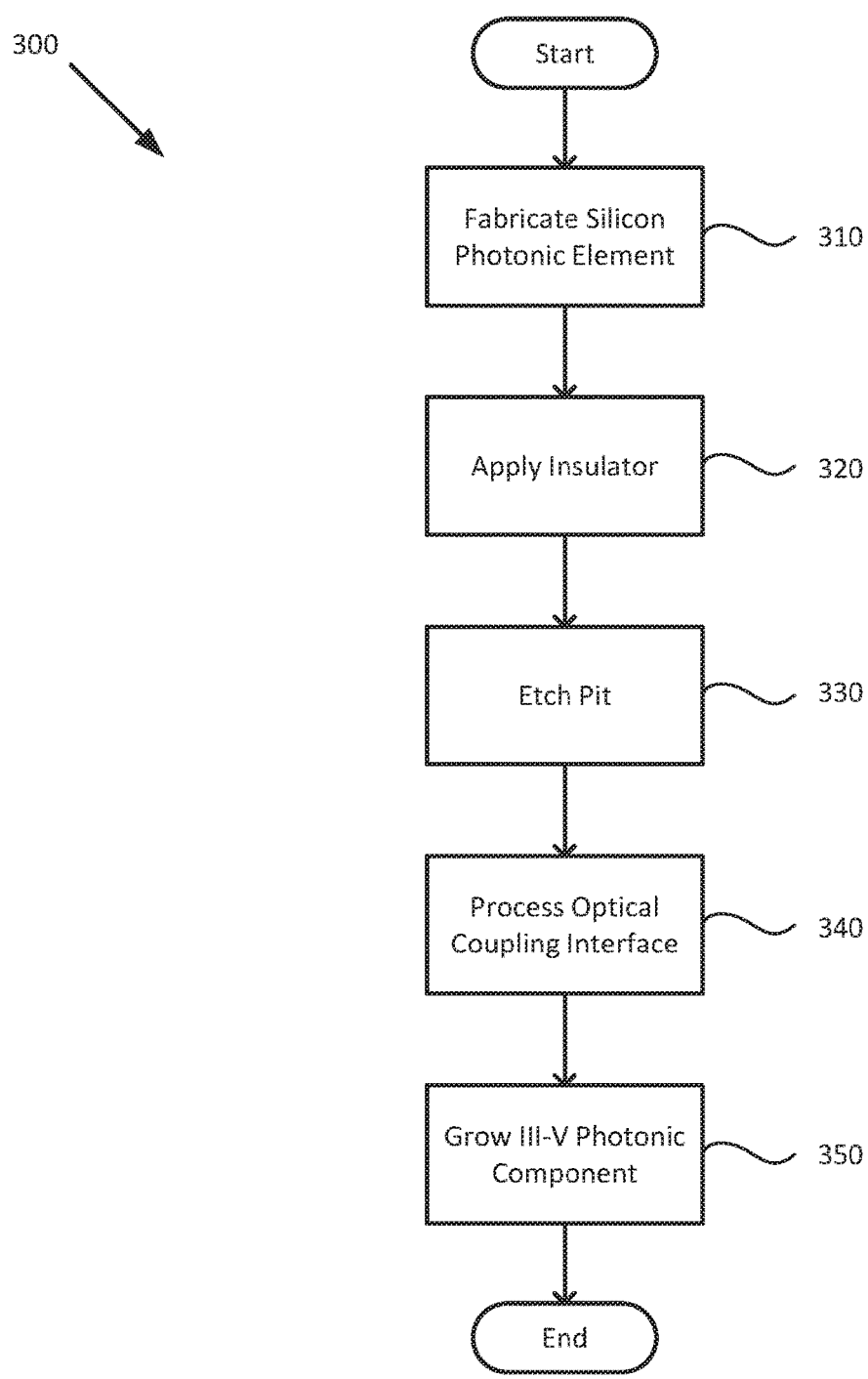
FIG. 3 is a flowchart of a method for fabricating a Silicon Photonic platform with a III-V component integrated via selective area growth, according to embodiments of the present disclosure.
Figure 4A:
FIGS. 4A-4G illustrate cutaway views of integrating a III-V component with a Silicon Photonic platform in various stages of fabrication via selective area growth, according to embodiments of the present disclosure.
Figure 4B:
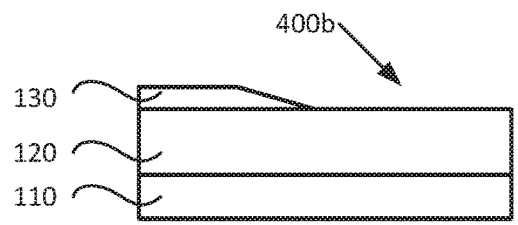
Figure 4C:
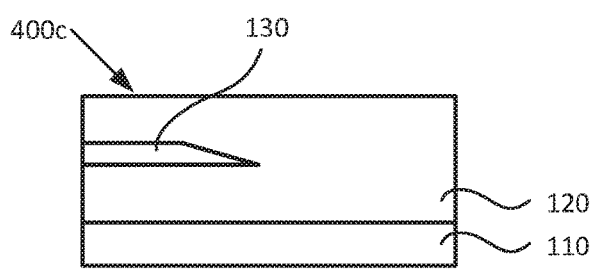
Figure 4D:
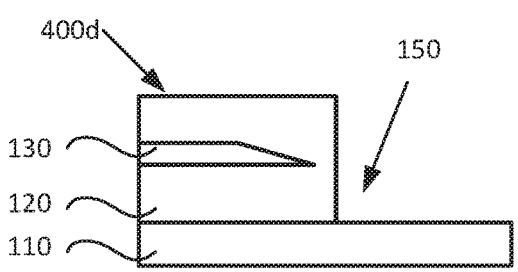
Figure 4E:
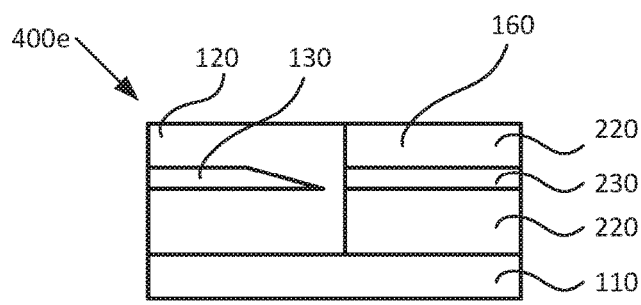
Figure 4F:
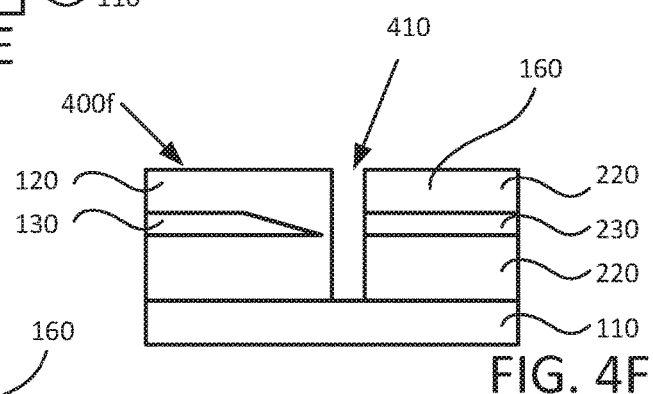
Figure 4G:
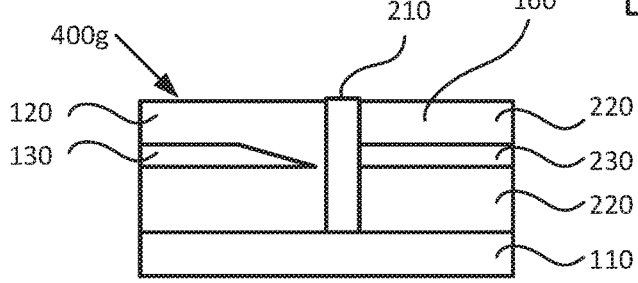

FIGS. 2A-2F illustrate cutaway views 200*a-f* (generally, view 200) of integrating a III-V component 160 with a SiPh platform 140 in various stages of fabrication via selective area growth. FIGS. 2A-2F may be understood in conjunction with the method 300 described in relation to the flowchart of FIG. 3.

At block 310, a fabricator fabricates the SiPh platform 140 to include a substrate 110, an insulator 120, and a passive optical layer 130. (First view 200*a*). In various embodiments, the fabricator creates the substrate from a bulk material (e.g., SiN, $SiO_2$, GaAs, InP) having an axis-aligned crystalline structure. In various embodiments, the fabricator cuts the bulk material into a wafer of desired dimensions with respect to the axis of alignment of the material matrix with cuts made in parallel and perpendicularly to the axis (i.e., on-axis) or at an offset from the axis (i.e., off-axis). The fabricator forms an insulator 120 from a first surface of the substrate 110, and forms various photonic elements in a passive optical layer 130 in the insulator 120. In various embodiments, the fabricator controls the height at which the photonic elements of the passive optical layer 130 so that various photonic elements are formed at known heights relative to the first surface of the substrate. The fabricator further shapes the photonic elements in the optical layer 130 into desired shapes and lengths via one or more etching processes, such applying a nano-taper to an end of a waveguide. (Second view 200*b*).

At block 320, the fabricator applies additional insulator 120 to capture the photonic elements of the passive optical layer 130 in the insulator 120. (Third view 200*c*). The fabricator forms the insulator 120 to a desired second height relative to the insulator 120 to define a form factor for the SiPh platform 140.

At block 330, the fabricator etches a pit 150 in the SiPh platform 140. (Fourth view 200*d*). The pit 150 may be defined in various shapes, and exposes a surface that may form an OCI 170 or over which an optical coating 210 may be grown to form an OCI 170. In some embodiments, the fabricator physically etches the pit 150 into the SiPh platform 140, while in other embodiments, the fabricator chemically etches the pit 150 into the SiPh platform 140 (e.g., applying a resist mask to portions of the SiPh platform 140 that are not to be etched out, and applying a caustic or reactive chemical etchant to the SiPh platform). In various embodiments, the fabricator etches the pit 150 to expose a first end of the photonic elements of the passive optical layer 130 to the pit 150, or leaves a portion of the insulator 120 of a desired thickness to separate the first end of the photonic elements from the pit 150.

At block 340, the fabricator processes the OCI 170 for the SiPh platform 140. (Fifth view 200*e*). In various embodiments, the fabricator forms one or more optical layers on a face of the SiPh platform 140 exposed by the pit 150. In some embodiments, the fabricator physically or chemically etches the exposed face of the pit 150 to provide a surface with a desired smoothness and distance from the photonic elements of the SiPh platform 140 (e.g., a fine etch or polish following a rough etch per block 330). For example, the fabricator may form an optical coating to affect a reflectivity or refractivity of the OCI 170.

At block 350, the fabricator forms a III-V component 160 in the pit 150 via selective area growth. (Sixth view 200*f*). In various embodiments, the fabricator applies a resist mask to the insulator 120 (and/or the OCI 170) to ensure that III-V materials are not formed on surfaces other than the exposed surface of the substrate 110. In various embodiments, the III-V component 160 is selectively formed in the pit 150 via epitaxial growth process, including, but not limited to: Chemical Vapor Deposition (CVD), Metal-Organic CVD (MOCVD), Molecular Beam Epitaxy (MBE), Vapor-Phase Epitaxy (VPE), Liquid-Phase Epitaxy (LPE), Solid-Phase Epitaxy (SPE), and Hydride Vapor Phase Epitaxy. The III-V material may include, but is not limited to: GaAs, GaN, GaSb, InSb, InAs, InP, etc.

The fabricator may form the III-V component 160 in stages from the substrate 110 to include cladding layers 220 of a III-V material surrounding an active gain medium 230. The active gain medium 230 may include quantum dots or quantum wells or quantum wires or bulk material to provide one or more of lasing or optical amplification when current is applied across the active gain medium 230 or to produce a voltage difference when an external light source is applied to the active gain medium 230 for optical detection. The cladding layers 220 are formed to surround the active gain medium 230 and provide a waveguide to amplify and direct light produced by the active gain medium 230 outward in one or more directions. In some embodiments, the III-V materials used in the cladding layers 220 are different than the III-V materials used in the active gain medium 230 or include different dopants.

In various embodiments, the active gain medium 230 includes a plurality of quantum dots or quantum wells that, when stimulated by an applied electrical current, emit photons. Quantum dots and quantum wells are nano-structures that exhibit various properties, such as light generation, based on quantum mechanical effects. Quantum wells are two-dimensional structures formed by a thin layer of a first material surrounded by wider-bandgap material and that allow electronic capture in one dimension (allowing planar two-dimensional movement). In contrast, quantum dots act as zero-dimensional entities, which enables three-dimensional capture of excited electrons (not allowing movement). The quantum dots are surrounded by the waveguides of the cladding layers 220 and are made of materials that have narrower bandgaps than the material of the cladding layers 220. As will be appreciated, the precise size, shape, and material of the quantum dots or wells will affect the color of coherent light produced by the laser.

The fabricator forms the III-V component 160 in the pit 150 to optically couple (via butt-coupling) with the photonic elements in the passive optical layer 130. The active gain medium 230 is formed at a predetermined height relative to the substrate 110 to allow for alignment with earlier-fabricated photonic elements in the passive optical layer 130. Additionally, the upper cladding layer 220 is formed to a predetermined height relative to the substrate 110 (e.g., the height of the insulator 120 surrounding the pit 150) to define the form factor for the SiPh platform 140.

As will be appreciated, various processes may be applied to etch the SiPh platform 140 into a desired shape or profile, add one or more photonic elements, and/or process the SiPh platform 140 into a final assembly. Similarly, various wafer processes may be performed on the SiPh platform 140 prior to or after bonding and/or forming the other layers, such as, for example, the inclusion of TSVs, alignment features, dicing a wafer into several dies for the SiPh platform 140, etc.

Figure 5:
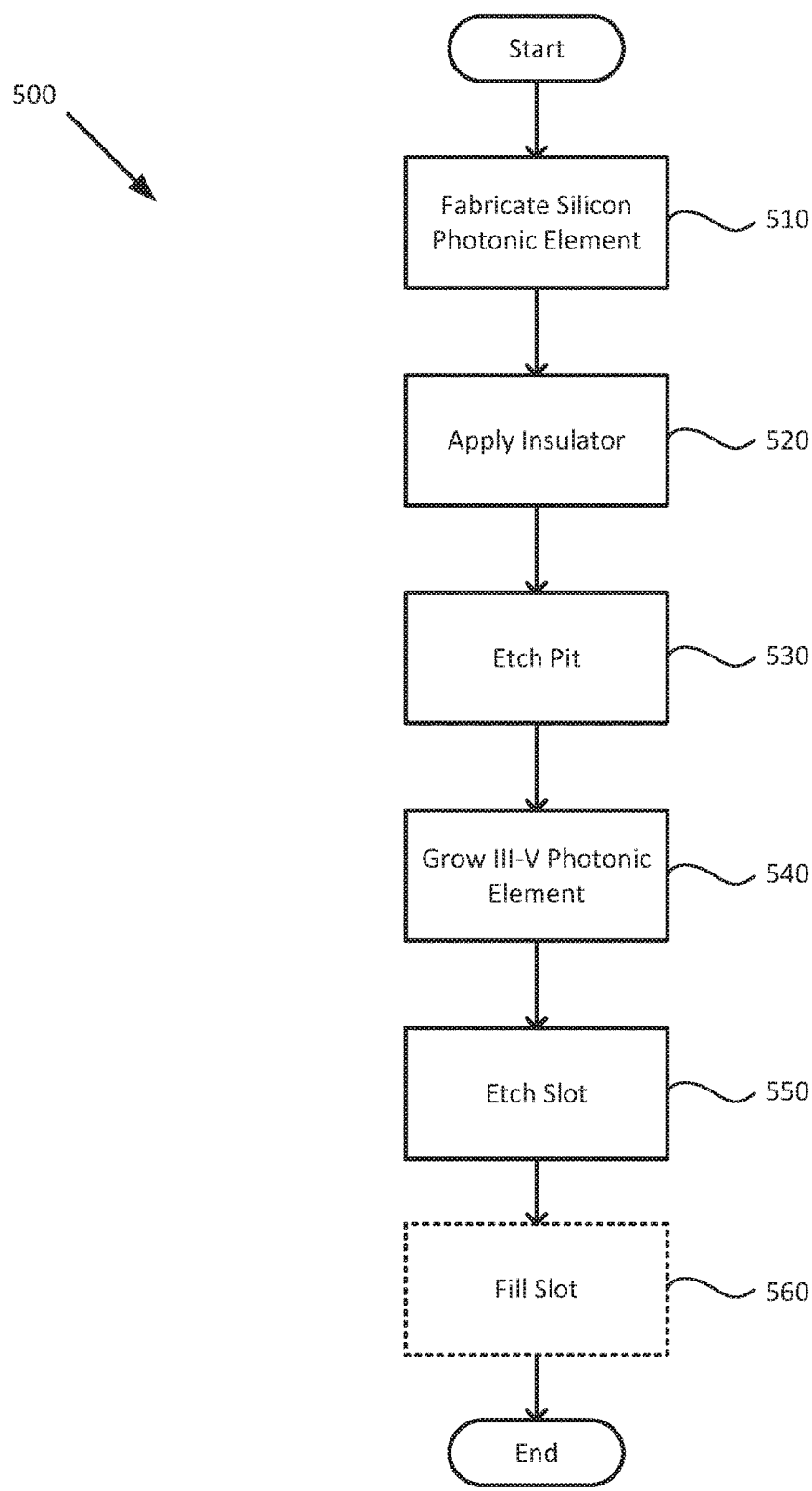
FIG. 5 is a flowchart of a method for fabricating a Silicon Photonic platform with a III-V component integrated via selective area growth, according to embodiments of the present disclosure.

FIGS. 4A-4G illustrate side views 400a-g (generally, view 400) of integrating a III-V component 160 with a SiPh platform in various stages of fabrication via selective area growth. FIGS. 4A-4G may be understood in conjunction with the method 500 described in relation to the flowchart of FIG. 5.

At block 510, a fabricator fabricates the SiPh platform 140 to include a substrate 110, an insulator 120, and a passive optical layer 130. (First view 400a). In various embodiments, the fabricator creates the substrate from a bulk material (e.g., SiN, $SiO_2$, GaAs, InP) having an axis-aligned crystalline structure. In various embodiments, the fabricator cuts the bulk material into a wafer of desired dimensions with respect to the axis of alignment of the material matrix with cuts made in parallel and perpendicularly to the axis (i.e., on-axis) or at an offset from the axis (i.e., off-axis). The fabricator forms an insulator 120 from a first surface of the substrate 110, and forms various photonic elements in a passive optical layer 130 in the insulator 120. In various embodiments, the fabricator controls the height at which the photonic elements of the passive optical layer 130 so that various photonic elements are formed at known heights relative to the first surface of the substrate. The fabricator further shapes the photonic elements in the optical layer 130 into desired shapes and lengths via one or more etching processes, such applying a nano-taper to an end of a waveguide. (Second view 400b).

At block 520, the fabricator applies additional insulator 120 to capture the photonic elements of the passive optical layer 130 in the insulator 120. (Third view 400c). The fabricator forms the insulator 120 to a desired second height relative to the insulator 120 to define a form factor for the SiPh platform 140.

At block 530, the fabricator etches a pit 150 in the SiPh platform 140. (Fourth view 400d). The pit 150 may be defined in various shapes, and exposes a surface that may form an OCI 170 or over which an optical coating 210 may be grown to form an OCI 170. In some embodiments, the fabricator physically etches the pit 150 into the SiPh platform 140, while in other embodiments, the fabricator chemically etches the pit 150 into the SiPh platform 140 (e.g., applying a resist mask to portions of the SiPh platform 140 that are not to be etched out, and applying a caustic or reactive chemical etchant to the SiPh platform). In various embodiments, the fabricator etches the pit 150 to expose a first end of the photonic elements of the passive optical layer 130 to the pit 150, or leaves a portion of the insulator 120 of a desired thickness to separate the first end of the photonic elements of from the pit 150.

At block 540, the fabricator forms a III-V component 160 in the pit 150 via selective area growth. (Fifth view 400e). In various embodiments, the fabricator applies a resist mask to the insulator 120 to ensure that III-V materials are not formed on surfaces other than the exposed surface of the substrate 110. In various embodiments, the III-V component 160 is selectively formed in the pit 150 via epitaxial growth process, including, but not limited to: Chemical Vapor Deposition (CVD), Metal-Organic CVD (MOCVD), Molecular Beam Epitaxy (MBE), Vapor-Phase Epitaxy (VPE), Liquid-Phase Epitaxy (LPE), Solid-Phase Epitaxy (SPE), and Hydride Vapor Phase Epitaxy. The III-V material may include, but is not limited to: GaAs, GaN, GaSb, InSb, InAs, InP, etc.

The fabricator may form the III-V component 160 in stages from the substrate 110 to include cladding layers 220 of a III-V material surrounding an active gain medium 230. The active gain medium 230 may include quantum dots or quantum wells or quantum wires or bulk material to provide one or more of lasing or optical amplification when current is applied across the active gain medium 230 or to produce a voltage difference when an external light source is applied to the active gain medium 230 for optical detection. The cladding layers 220 are formed to surround the active gain medium 230 and provide a waveguide to amplify and direct light produced by the active gain medium 230 outward in one or more directions. In some embodiments, the III-V materials used in the cladding layers 220 are different than the III-V materials used in the active gain medium 230 or include different dopants.

In various embodiments, the active gain medium 230 includes a plurality of quantum dots or quantum wells that, when stimulated by an applied electrical current, emit photons. Quantum dots and quantum wells are nano-structures that exhibit various properties, such as light generation, based on quantum mechanical effects. Quantum wells are two-dimensional structures formed by a thin layer of a first material surrounded by wider-bandgap material and that allow electronic capture in one dimension (allowing planar two-dimensional movement). In contrast, quantum dots act as zero-dimensional entities, which enables three-dimensional capture of excited electrons (not allowing movement). The quantum dots are surrounded by the waveguides of the cladding layers 220 and are made of materials that have narrower bandgaps than the material of the cladding layers 220. As will be appreciated, the precise size, shape, and material of the quantum dots or wells will affect the color produced by the laser.

The fabricator forms the III-V component 160 in the pit 150 to optically couple (via butt-coupling) with the photonic elements in the passive optical layer 130. The active gain medium 230 is formed at a predetermined height relative to the substrate 110 to allow for alignment with earlier-fabricated photonic elements in the passive optical layer 130. Additionally, the upper cladding layer 220 is formed to a predetermined height relative to the substrate 110 (e.g., the height of the insulator 120 surrounding the pit 150) to define the form factor for the SiPh platform 140.

At block 550, the fabricator etches a slot 410 between the Si elements (e.g, the insulator 120 and the passive optical layer 130) and the III-V component 160. (Sixth view 400*f*). In various embodiments, the fabricator uses a physical or a chemical etching process to define the slot 410 by removing material from at least one of the Si elements and the III-V component 160. For example, the fabricator may etch the slot 410 by removing material only from the Si elements, only from the III-V component 160, or both the Si elements and the III-V component 160. In various embodiments using a chemical etchant, the fabricator applies a resist mask to the insulator 120 and the III-V component 160 to ensure that only exposed materials are removed. Although the slot 410 is illustrated as being formed from the top surface of the SiPh platform 140 to the substrate 110, in some embodiments, the slot 410 may be more shallow; exposing the interface between the passive optical layer 130 and the active gain medium 230, but leaving the substrate 110 unexposed.

At optional block 560, the fabricator fills the slot 410 with an optical coating 210. (Seventh view 400*g*). In various embodiments, the fabricator forms one or more optical layers on a face of the SiPh platform 140 exposed by the slot 410. For example, the fabricator may form an optical coating 210 to affect a reflectivity or refractivity of the OCI 170. In embodiments of method 500 that omit optional block 560, the fabricator leaves the slot 410 unfilled; providing an OCI 170 with an air-gap between the active gain medium 230 and the photonic elements of the passive optical layer 130 (i.e., an airgap OCI). In some embodiments, the fabricator physically or chemically etches the exposed face of the slot 410 to provide a surface with a desired smoothness and distance from the photonic elements of the (e.g., a fine etch or polish following a rough etch per block 550).

As will be appreciated, various processes may be applied to etch the SiPh platform 140 into a desired shape or profile, add one or more photonic elements, and/or process the SiPh platform 140 into a final assembly. Similarly, various wafer processes may be performed on the SiPh platform 140 prior to or after bonding and/or forming the other layers, such as, for example, the inclusion of TSVs, alignment features, dicing a wafer into several dies for the SiPh platform 140, etc.

Figure 6:
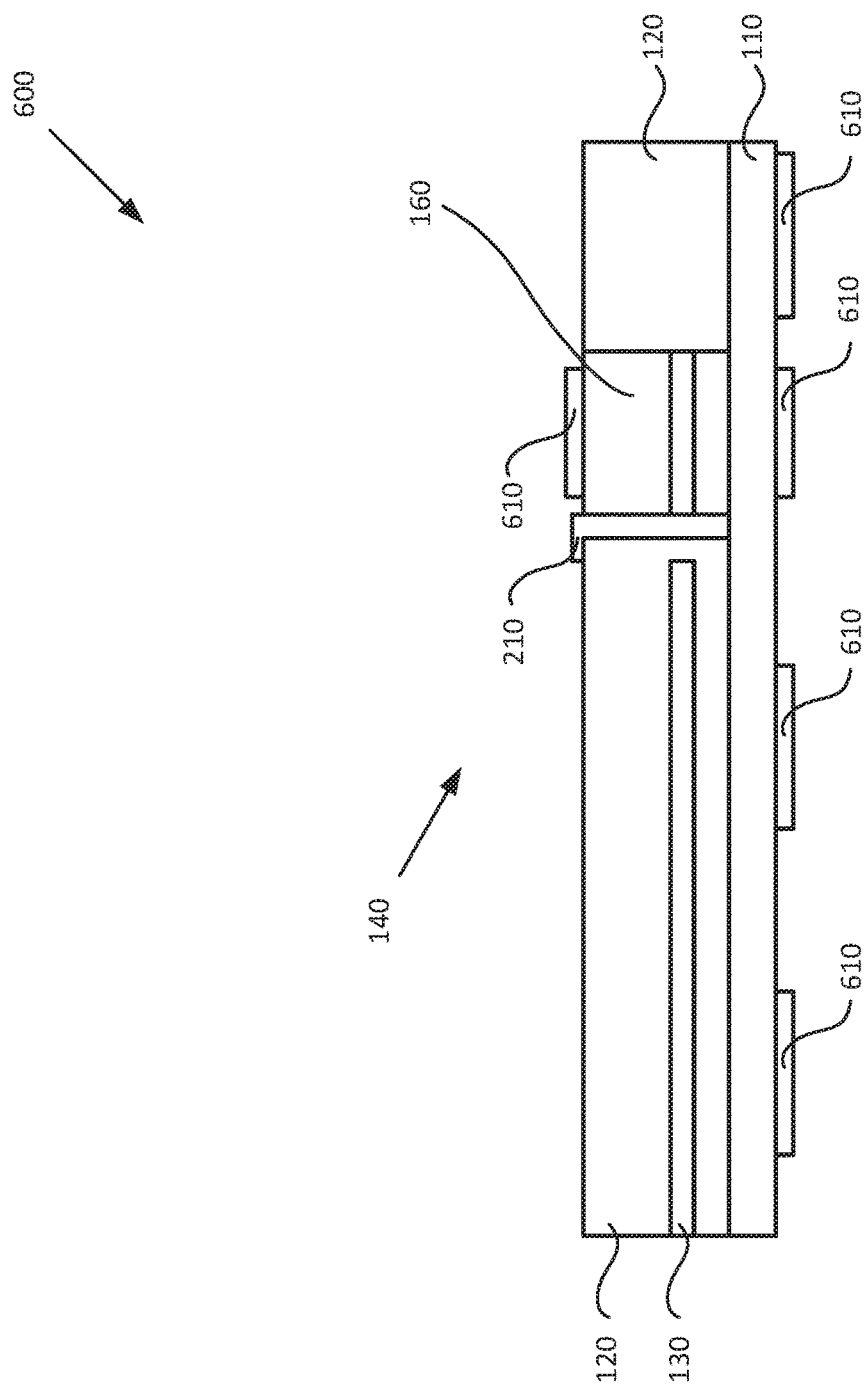
FIG. 6 illustrates an optical assembly with an integrated III-V component in a Silicon Photonic platform, according to embodiments of the present disclosure.

FIG. 6 illustrates an optical assembly 600 with an integrated III-V component 160 in a SiPh platform 140. The III-V component 160 is selectively formed in the semiconductor layers of the SiPh platform 140, which may constitute a final optical assembly 600 in some embodiments. Any waveguides internal to the passive optical layer 130 are aligned with the waveguides of the III-V component 160. In various embodiments, different surface treatments are applied to the OCI 170 to affect the reflectivity and refractive index for light passing between the integrated III-V component 160 and the passive optical layer 130.

The fabricator may incorporate various contact pads 610 to the optical assembly 600 via metallization (e.g., via evaporation or sputtering processes) so as to add TSVs, electrical leads, and passive connection points so that other components can be physically attached to and/or electrically connected to the optical assembly 600. The contact pads 610 may include electrical leads that pass through the dielectric and terminate in one or more pads 360 (e.g., TSVs). In some embodiments, the contact pads 610 are positioned on opposite side of the III-V component 160 (and may pass through the substrate 110) for a voltage to be applied across the III-V component to generate or amplify an optical signal.

Figure 7:
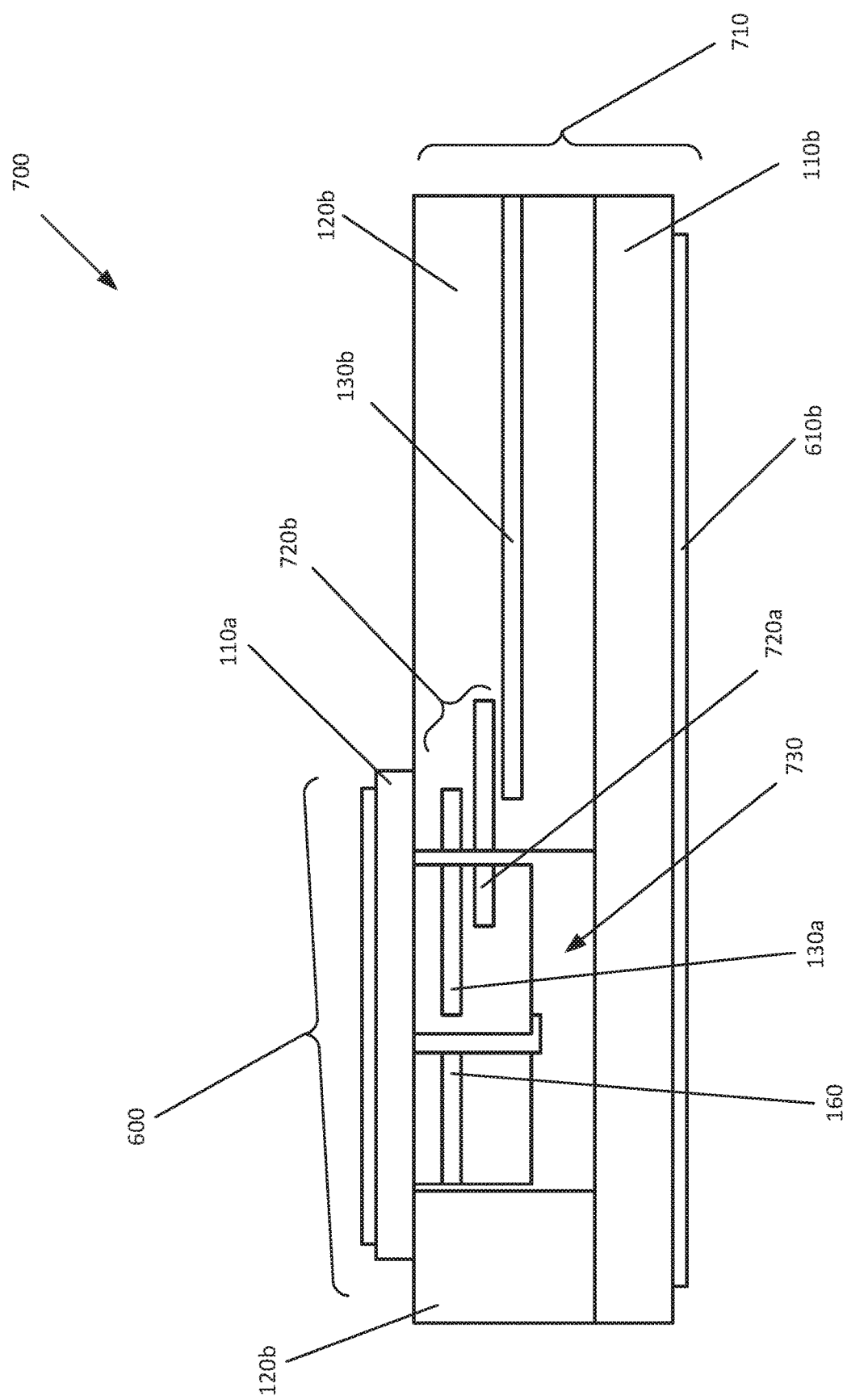
FIG. 7 illustrates a second optical assembly using a first optical assembly with an integrated III-V component in a Silicon Photonic platform as a sub-assembly with a carrier, according to embodiments of the present disclosure.

FIG. 7 illustrates a second optical assembly 700 using a first optical assembly 600 with an integrated III-V component 160 in a SiPh platform 140 as a sub-assembly with a carrier 710. The first optical assembly 600 is fabricated separately from the carrier 710, and may be attached in a pocket 730 defined in the carrier 710 via one or more a solder bonds or wire bonds. The carrier 710 may include carrier contact pads 610*b* where the assembly substrate 110*a* of the first optical assembly 600 is attached, as well as carrier contact pads 610*b* on other portions of the carrier 710 to allow other components to be physically attached to and/or electrically connected to the second optical assembly 700.

The carrier 710 may be a pre-fabricated optical component that includes a carrier substrate 110*b* (which may be formed from a different material or a same material with a different axial cut than the assembly substrate 110*a* of the first optical assembly 600), a carrier insulator 120*b*, and a carrier passive optical layer 130*b*. The waveguides in the carrier passive optical layer 130*b* of the carrier 710 are aligned with the waveguides in the assembly passive optical layer 130*a* of the first optical assembly 600 by a pair of optical couplers; a first optical coupler 720*a* in the first optical assembly 600 and a second optical coupler 720*b* in the carrier 710. Although illustrated as nitride prong connectors, the optical couplers 720*a* and 720*b* may also include silicon nano-taper couplers, adiabatic evanescent couplers, and directional couplers in various embodiments. The fabricator forms the relative heights of the carrier insulator 120*b* and the carrier waveguide (or connectors) in the carrier passive optical layer 130*b* to the relative heights of the III-V component 160, assembly insulator 120*a*, and assembly passive optical layer 130a of the first optical assembly 600. For example, with a first optical assembly 600 having an assembly insulator 120a that extends a first distance from the assembly substrate 110a and an assembly passive optical layer 130a that extends a second distance from the assembly substrate 110a, the carrier 710 may have a carrier insulator 120b that extends a third distance from the carrier substrate 110b to a mounting surface for the first optical assembly 600 that is at least as great as the first distance (to accommodate the first optical assembly 600 in the pocket 730). Similarly, the fabricator may form the carrier passive optical layer 130b of the carrier 710 at a fourth distance relative to the mounting surface of the carrier insulator 120b that is the same as the second distance that the assembly passive optical layer 130a extends from the assembly substrate 110a of the first optical assembly 600 to align the carrier passive optical layers 130b and the assembly optical layers 130a when the first optical assembly 600 is captured in the pocket 730. The assembly passive optical layer 130a of the first optical assembly 600 thus creates an optical pathway for the III-V component 160 to the carrier passive optical layer 130b of the carrier 710.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A method, comprising:
    fabricating a passive photonic element on a substrate, wherein the passive photonic element includes a silicon waveguide;
    forming a dielectric on the passive photonic element;
    etching a pit through the dielectric and the passive photonic element to the substrate, the pit defining an optical coupling interface (OCI) for the passive photonic element;
    forming an optical coating on the OCI affecting a reflectivity of the OCI; and
    forming an active III-V component in the pit, wherein the active III-V component butt couples with the passive photonic element via the OCI.

2. The method of claim 1, wherein the substrate is selected from one of:
    an off-cut Silicon material, cut between 1° and 10° from a material matrix axis of the substrate;
    an on-cut Silicon material; and
    an on-cut III-V substrate material.

3. The method of claim 1, wherein the passive photonic element further includes one of:
    a silicon nano-taper coupler; and
    a nitride prong coupler.

4. The method of claim 3, wherein the active III-V component is formed to include a gain medium that includes a plurality of quantum dots and is aligned with the one of the silicon nano-taper coupler and the nitride prong coupler to optically couple the gain medium to the silicon waveguide.

5. The method of claim 1, wherein forming the active III-V component uses an epitaxial growth process in which a first cladding layer is formed on the substrate, a gain medium is formed on the first cladding layer, and a second cladding layer is formed on the gain medium.

6. The method of claim 1, further comprising:
    forming a first cladding layer directly on the substrate in the pit;
    forming a gain medium directly on the first cladding layer; and
    forming a second cladding layer directly on the gain medium.

7. A method, comprising:
    fabricating a passive photonic element, including a substrate, wherein the passive photonic element includes a silicon waveguide;
    forming a dielectric on the passive photonic element;
    etching a pit through the dielectric and the passive photonic element to the substrate;
    forming an active III-V component in the pit, wherein the active III-V component butt couples with the passive photonic element; and
    etching a slot between the active III-V component and the dielectric, the slot defining an optical coupling interface (OCI) between the passive photonic element and the active III-V component.

8. The method of claim 6, further comprising filling the slot with an optical coating to affect at least one of:
    a reflectivity between the active III-V component and the passive photonic element; and
    a refractive index between the active III-V component and the passive photonic element.

9. The method of claim 6, wherein the substrate is an off-cut Silicon material, cut between 1° and 10° off of a material matrix axis of the substrate.

10. The method of claim 7, wherein the passive photonic element further includes one of:
    a silicon nano-taper coupler; and
    a nitride prong coupler.

11. The method of claim 7, wherein growing the active III-V component uses an epitaxial growth process in which a first cladding layer is formed on the substrate, a gain medium is formed on the first cladding layer, and a second cladding layer is formed on the gain medium.

12. A method, comprising:
    fabricating a passive photonic element on a substrate, wherein the passive photonic element includes a silicon waveguide;
    forming a dielectric on the passive photonic element;
    etching a pit through the dielectric and the passive photonic element to the substrate, the pit defining a first optical coupling interface (OCI) for the passive photonic element and a second OCI for the passive photonic element on an opposite side of the pit from the first OCI;

forming an optical coating on the first OCI affecting a reflectivity of the first OCI; and forming an active III-V component in the pit, wherein the active III-V component butt couples with the passive photonic element via the first OCI and the second OCI.

13. The method of claim 12, further comprising:

forming a second optical coating on the second OCI.

14. The method of claim 13, wherein the passive photonic element is an adiabatic coupler.

15. The method of claim 12, wherein the second OCI defines an airgap.

16. The method of claim 12, wherein the dielectric is $SiO_2$.

17. The method of claim 12, wherein the active III-V component includes a plurality of quantum dots defined therein.

18. The method of claim 12, wherein fabricating the passive photonic element on the substrate further comprises:

defining a passive optical layer on the dielectric; and shaping the passive optical layer to define a desired shape.

19. The method of claim 12, wherein the substrate is an off-cut Silicon material, cut between 1° and 10° from a material matrix axis of the substrate.

20. The method of claim 12, wherein the pit defines a rectangular prism in the dielectric.

* * * * *

UNITED STATES PATENT AND TRADEMARK OFFICE
CERTIFICATE OF CORRECTION

| | | |
|---|---|---|
| PATENT NO. | : 11,018,473 B1 | Page 1 of 1 |
| APPLICATION NO. | : 16/203463 | |
| DATED | : May 25, 2021 | |
| INVENTOR(S) | : Dominic F. Siriani et al. | |

It is certified that error appears in the above-identified patent and that said Letters Patent is hereby corrected as shown below:

In the Claims

In Column 10, Line 39, in Claim 8, delete "claim 6," and insert -- claim 7, --.

In Column 10, Line 45, in Claim 9, delete "claim 6," and insert -- claim 7, --.

Signed and Sealed this
Tenth Day of January, 2023

*Katherine Kelly Vidal*

Katherine Kelly Vidal
*Director of the United States Patent and Trademark Office*